US011885848B2

(12) United States Patent
Otani et al.

(10) Patent No.: US 11,885,848 B2
(45) Date of Patent: Jan. 30, 2024

(54) METHOD FOR ASSESSING REMAINING LIFE OF ROTATING ELECTRICAL MACHINE AND DEVICE FOR ASSESSING REMAINING LIFE OF ROTATING ELECTRICAL MACHINE

(71) Applicant: Mitsubishi Electric Corporation, Tokyo (JP)

(72) Inventors: Tadao Otani, Osaka (JP); Kazuo Hayashi, Tokyo (JP); Hiroshige Fujita, Tokyo (JP); Wataru Nagaya, Tokyo (JP); Shinsuke Miki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 401 days.

(21) Appl. No.: 17/284,789

(22) PCT Filed: Nov. 15, 2019

(86) PCT No.: PCT/JP2019/044882
§ 371 (c)(1),
(2) Date: Apr. 13, 2021

(87) PCT Pub. No.: WO2020/105557
PCT Pub. Date: May 28, 2020

(65) Prior Publication Data
US 2021/0405117 A1    Dec. 30, 2021

(30) Foreign Application Priority Data

Nov. 20, 2018  (JP) ................... 2018-217170

(51) Int. Cl.
*G01R 31/34* (2020.01)
(52) U.S. Cl.
CPC .................. *G01R 31/34* (2013.01)

(58) Field of Classification Search
CPC ...................................................... G01R 31/34
(Continued)

(56) References Cited

U.S. PATENT DOCUMENTS

2020/0036321 A1\*  1/2020  Morita ................... G01R 31/72

FOREIGN PATENT DOCUMENTS

CN    104204828 A  \* 12/2014 ........... G01R 31/028
JP    58-29873 A       2/1983
(Continued)

OTHER PUBLICATIONS

Goto et al., "Aging Deterioration of Generator Insulation", The Institute of Electrical Engineers of Japan, The Papers of Technical Meeting on Electrical Insulation (Paper No. EIM-87-103), Nov. 17, 1987, 16 pages including English Translation.
(Continued)

*Primary Examiner* — Kawing Chan
(74) *Attorney, Agent, or Firm* — XSENSUS LLP

(57) ABSTRACT

A device for assessing remaining life of a rotating electrical machine includes: a data acquisition unit configured to acquire actual running performance data and electrical data about the rotating electrical machine to be assessed; an index value calculation unit configured to calculate a first index value to a third index value based on the acquired data, and to calculate, as a fourth index value, an estimation value of a residual withstand voltage value of the rotating electrical machine by performing analysis that uses an MT method on each piece of the electrical data; and an insulation deterioration estimation unit configured to assess the remaining life of the rotating electrical machine by estimating the remaining life of the rotating electrical machine with use of four index values from the first index value to the fourth index value.

3 Claims, 3 Drawing Sheets

(58) Field of Classification Search
USPC .................................................. 318/799
See application file for complete search history.

(56) References Cited

FOREIGN PATENT DOCUMENTS

| JP | 3-60351 A | 3/1991 |
|---|---|---|
| JP | 2002-297709 A | 10/2002 |
| JP | 2005-61901 A | 3/2005 |
| JP | 2013-24669 A | 2/2013 |
| JP | 2015-128182 A | 7/2015 |
| KR | 101267946 B1 * | 5/2013 |
| KR | 101681922 B1 * | 12/2016 |

OTHER PUBLICATIONS

Hirabayashi et al., "Secular Changes of High-Voltage Generator Insulation", Mitsubishi Electric Technical Report, vol. 54, No. 3, 1980, pp. 26-30 (6 pages including English Translation).

Terase., "Relationship between the Second Rapid Current Increase Point of a Generator Coil and AC Breakdown Voltage", The Institute of Electrical Engineers of Japan, The Journal of the Institute of Electrical Engineers of Japan, vol. 81, Issue 872, May 1961, pp. 808-816; 84-91 (10 pages including English Translation).

Haga., "Insulation Diagnosis Technique for Turbine Generators", Thermal and Nuclear Power Engineering Society, The Thermal and Nuclear Power, vol. 51, No. 8, Aug. 15, 2000, pp. 24-30.

Ueno., "Residual Life Estimation and Repair for Turbine Generators", Thermal and Nuclear Power Engineering Society, The Thermal and Nuclear Power, vol. 52, No. 1, Jan. 15, 2001, pp. 17-25.

International Search Report and Written Opinion dated Dec. 24, 2019, received for PCT Application PCT/JP2019/044882, Filed on Nov. 15, 2019, 9 pages including English Translation.

Japanese Office Action issued in corresponding Japanese application No. 2020558351, dated Aug. 23, 2022.

Japanese Office Action issued in corresponding Japanese application No. 2020558351, dated May 31, 2022.

* cited by examiner

METHOD FOR ASSESSING REMAINING LIFE OF ROTATING ELECTRICAL MACHINE AND DEVICE FOR ASSESSING REMAINING LIFE OF ROTATING ELECTRICAL MACHINE

CROSS-REFERENCE TO RELATED APPLICATIONS

The present application is based on PCT filing PCT/JP2019/044882, filed Nov. 15, 2019, which claims priority to JP 2018-217170, filed Nov. 20, 2018, the entire contents of each are incorporated herein by reference.

TECHNICAL FIELD

The present invention relates to a device and method for assessing remaining life of a motor, a generator, or a similar rotating electrical machine that includes an insulator by estimating a residual withstand voltage value of the rotating electrical machine.

BACKGROUND ART

An insulating material used in a rotating electrical machine deteriorates with age due to a surrounding environment, electrical stress, mechanical stress, and other factors. In order to prevent an accident involving the rotating electrical machine and plan efficient maintenance as well as an appropriate schedule for updating the rotating electrical machine, a technology of estimating a residual withstand voltage value of a winding insulating material of the rotating electrical machine is indispensable.

For instance, among air-cooled turbine generators of today, generators that are targets of maintenance are mainly Class-B insulation machines supplied by the latter half of 1970s. Class B is one of insulation classes. Technologies of assessing/evaluating the deterioration of the Class-B insulation machines have already been established (see, Non-Patent Literature 1, for example).

CITATION LIST

Patent Literature

[PTL 1] JP 2005-61901 A

Non-Patent Literature

[NPL 1] "Aging Deterioration of Generator Insulation," The Institute of Electrical Engineers of Japan, The Papers of Technical Meeting on Electrical Insulation (Paper Number: EIM-87-103, Nov. 17, 1987
[NPL 2] "Secular Changes of High-Voltage Generator Insulation," Mitsubishi Electric Technical Report, Vol. 54, No. 3, 1980, pp. 26-30
[NPL 3] "A Relationship between the Second Rapid Current Increase Point of a Generator Coil and AC Breakdown Voltage," The Journal of the Institute of Electrical Engineers of Japan, Vol. 81, Issue 872, May 1961, pp. 808-816

SUMMARY OF INVENTION

Technical Problem

However, main targets of insulation update from now on are Class-F insulation machines supplied after the latter half of 1970s. It is therefore an urgent task to establish an evaluation technology concerning insulation deterioration assessment for Class-F insulation machines.

The present invention has been made to solve the above-mentioned problem, and an object thereof is to obtain a device for assessing remaining life of a rotating electrical machine and a method of assessing remaining life of a rotating electrical machine that are applicable to insulation deterioration assessment for Class-F insulation machines as well.

Solution to Problem

According to one embodiment of the present invention, there is provided a method of assessing remaining life of a rotating electrical machine for use in assessment of remaining life of a rotating electrical machine that includes an insulator, the method including: an acquisition step of acquiring, as actual running performance data about the rotating electrical machine which is a target of assessment, a running time of, and the number of times of activation/shutdown of, the rotating electrical machine, and acquiring, as electrical data about the rotating electrical machine, a dielectric tangent, a rapid current increase voltage value, a current increase rate, and a maximum discharge charge amount; a storage step of storing, in advance, in a storage unit, an association relationship between the maximum discharge charge amount and a residual withstand voltage value as a first table, and an association relationship between the rapid current increase voltage value and the residual withstand voltage value as a second table; a first estimation step of calculating, as a first index value, an estimation value of the residual withstand voltage value of the rotating electrical machine based on the actual running performance data acquired in the acquisition step; a second estimation step of calculating, as a second index value, an estimation value of the residual withstand voltage value of the rotating electrical machine, with use of the first table, from the maximum discharge charge amount acquired in the acquisition step; a third estimation step of calculating, as a third index value, an estimation value of the residual withstand voltage value of the rotating electrical machine, with use of the second table, from the rapid current increase voltage value acquired in the acquisition step; a fourth estimation step of calculating, as a fourth index value, an estimation value of the residual withstand voltage value of the rotating electrical machine by performing analysis that uses an MT method on each piece of the electrical data acquired in the acquisition step; and a remaining life assessment step of assessing the remaining life of the rotating electrical machine by estimating the remaining life of the rotating electrical machine with use of four index values from the first index value to the fourth index value.

Further, according to one embodiment of the present invention, there is provided a device for assessing remaining life of a rotating electrical machine for use in assessment of remaining life of a rotating electrical machine that includes an insulator, the device including: a data acquisition unit configured to acquire, as actual running performance data about the rotating electrical machine which is a target of assessment, a running time of, and the number of times of activation/shutdown of, the rotating electrical machine, and to acquire, as electrical data about the rotating electrical machine, a dielectric tangent, a rapid current increase voltage value, a current increase rate, and a maximum discharge charge amount; a storage unit configured to store, in advance, an association relationship between the maximum discharge charge amount and a residual withstand voltage value as a first table, and to store, in advance, an association relationship between the rapid current increase voltage value and the residual withstand voltage value as a second table; an index value calculation unit configured to: calculate, as a first index value, an estimation value of the residual withstand voltage value of the rotating electrical machine based on the actual running performance data acquired by the data acquisition unit; calculate, as a second index value, an estimation value of the residual withstand voltage value of the rotating electrical machine, with use of the first table, from the maximum discharge charge amount acquired by the data acquisition unit; calculate, as a third index value, an estimation value of the residual withstand voltage value of the rotating electrical machine, with use of the second table, from the rapid current increase voltage value acquired by the data acquisition unit; and calculate, as a fourth index value, an estimation value of the residual withstand voltage value of the rotating electrical machine by performing analysis that uses an MT method on each piece of the electrical data acquired by the data acquisition unit; and an insulation deterioration estimation unit configured to assess the remaining life of the rotating electrical machine by estimating the remaining life of the rotating electrical machine with use of four index values from the first index value to the fourth index value.

Advantageous Effects of Invention

According to the present invention, the configuration in which the insulation deterioration assessment is performed by taking into account the result of estimation by the MT method is included. The device for assessing remaining life of a rotating electrical machine and the method of assessing remaining life of a rotating electrical machine that are applicable to insulation deterioration assessment for Class-F insulation machines can consequently be obtained.

DESCRIPTION OF EMBODIMENTS

A device for assessing remaining life of a rotating electrical machine according to a preferred embodiment of the present invention and a method of assessing remaining life of a rotating electrical machine according to the preferred embodiment are described below with reference to the drawings. The following description takes a generator which is a type of rotating electrical machines as an example. The term "remaining life" used in the following description means a residual break down voltage (BVD) value of stator winding in the generator to be assessed, and is a value estimated in relation to a residual withstand voltage value Vr (%) described later.

First Embodiment

Figure 1:
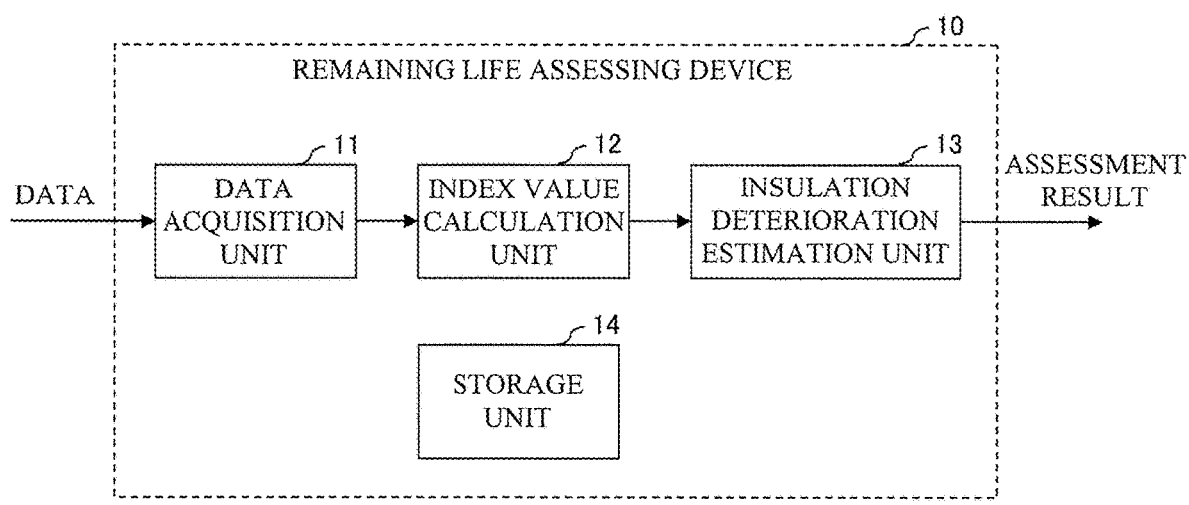
FIG. 1 is a diagram for illustrating a configuration of a device for assessing remaining life of a generator according to a first embodiment of the present invention.

FIG. 1 is a diagram for illustrating a configuration of a device for assessing remaining life of a generator according to a first embodiment of the present invention. A remaining life assessing device 10 according to the first embodiment is configured to estimate a residual withstand voltage value of a winding insulating material in the form of a plurality of index values based on a variety of pieces of acquired data about the generator including the insulator, and output an assessment result about remaining life from the result of estimating the plurality of index values.

Specifically, the remaining life assessing device 10 according to the first embodiment includes a data acquisition unit 11, an index value calculation unit 12, an insulation deterioration estimation unit 13, and a storage unit 14.

The data acquisition unit 11 is configured to acquire a running time of the generator and the number of times of activation/shutdown of the generator as actual running performance data of the generator to be assessed. The actual running performance data can be acquired from a customer at the time of periodic inspection, for example.

The data acquisition unit 11 is configured to further acquire, as electrical data of the generator to be assessed, the following four items.

Δ tan δ: Dielectric tangent
Pi: Rapid current increase voltage value
ΔI: Current increase rate
Qmax: Maximum discharge charge amount The electrical data can be acquired by, for example, an insulation test of the generator to be assessed.

The index value calculation unit 12 is configured to calculate the following four index values based on the actual running performance data and electrical data acquired by the data acquisition unit 11, to thereby calculate an estimation value of a residual withstand voltage value concerning a winding insulating material of the generator to be assessed in the form of four index values.

Figure 3:
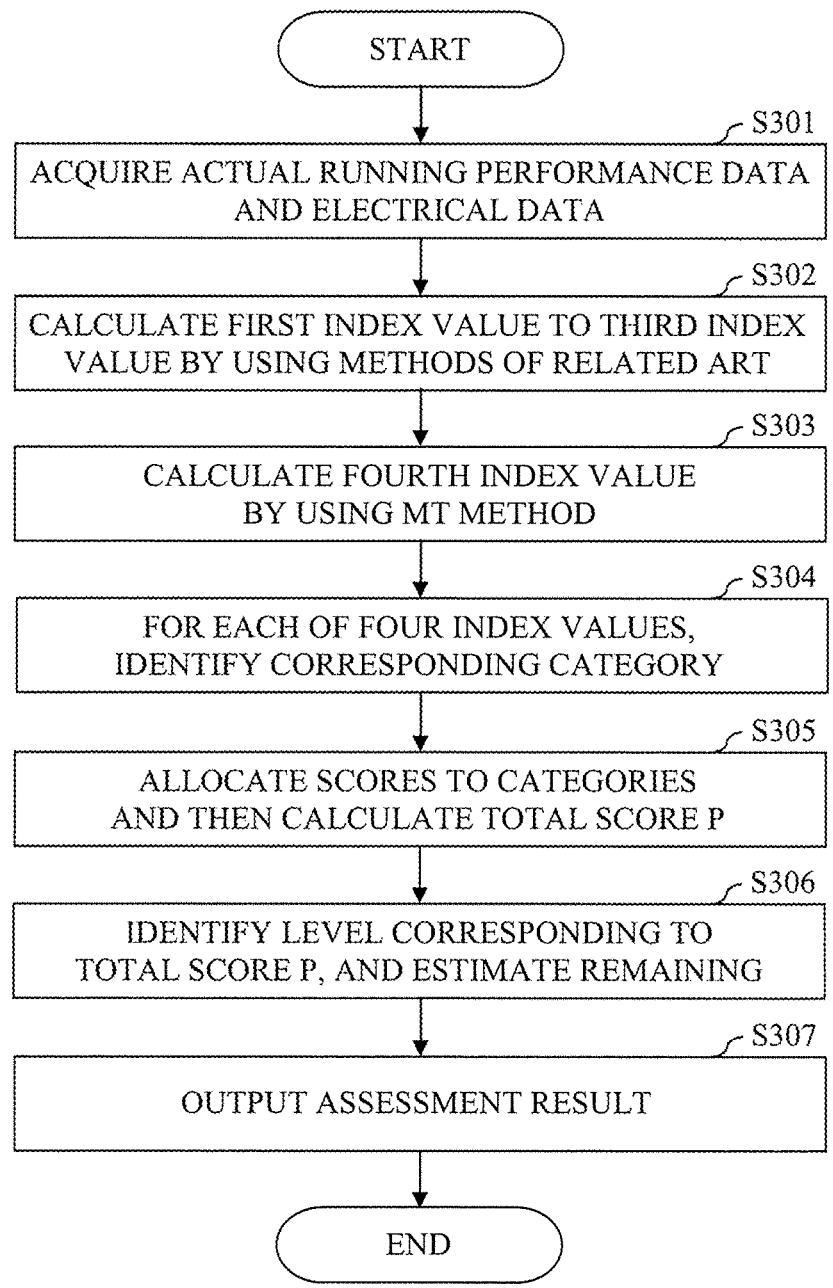
FIG. 3 is a flow chart for illustrating a series of processing steps of a remaining life assessment method to be executed by the device for assessing remaining life according to the first embodiment of the present invention.

First index value: an estimation value of the residual withstand voltage value that is calculated based on the running time of the generator and the number of times of activation/shutdown of the generator Second index value: an estimation value of the residual withstand voltage value that is calculated from an association relation between Qmax and a residual withstand voltage value Third index value: an estimation value of the residual withstand voltage value that is calculated from an association relation between Pi and a residual withstand voltage value Fourth index value: an estimation value of the residual withstand voltage value that is calculated by performing an analysis on the four items, namely, Δ tan δ, Pi, ΔI, and Qmax, with the use of the MT method The first index value, the second index value, and the third index value have been used hitherto as methods of calculating the residual withstand voltage value. An example of a method of calculating the first index value is illustrated in FIG. 3 of Non-Patent Literature 1, and an example of a method of calculating the second index value is illustrated in FIG. 5 of Non-Patent Literature 2. An example of a method of calculating the third index value is illustrated in FIG. 3 of Non-Patent Literature 3.

The fourth index value, on the other hand, is a method newly employed in order to estimate the residual withstand voltage value. The MT method used in calculation of the fourth index value is the Mahalanobis-Taguchi method. The MT method has been employed in assessment of remaining insulation lives of switchgears manufactured by Mitsubishi Electric Corporation since around 2003 (see Patent Literature 1, for example). From that experience, a specific method of applying the MT method to estimation of the residual withstand voltage value of a winding insulating material of a generator has been established, and details of the established method are thus described below.

The MT method involves determining coordinates of a point to serve as a reference in a multidimensional space constructed from a plurality of parameters, and performing deterioration assessment or pattern recognition by calculating a distance from the determined coordinates to coordinates of each piece of data.

Seven normal generators and four used generators that had actually been in operation in the field, that is, eleven generators in total, were used as samples to select parameters appropriate for estimation of a residual withstand voltage value concerning a winding insulating material of a generator by applying the MT method. As a result, a conclusion that the use of electrical data including four items that are $\Delta \tan \delta 1$, $Pi1$, $\Delta I$, and $Qmax1$ as the parameters is appropriate was reached.

The insulation deterioration estimation unit 13 is configured to execute assessment processing concerning remaining life, based on the four index values calculated by the index value calculation unit 12, and output a result of the assessment. The assessment processing executed by the insulation deterioration estimation unit 13 is described in detail below with reference to FIG. 2, FIG. 3, and Table 1 to Table 5.

Figure 2:
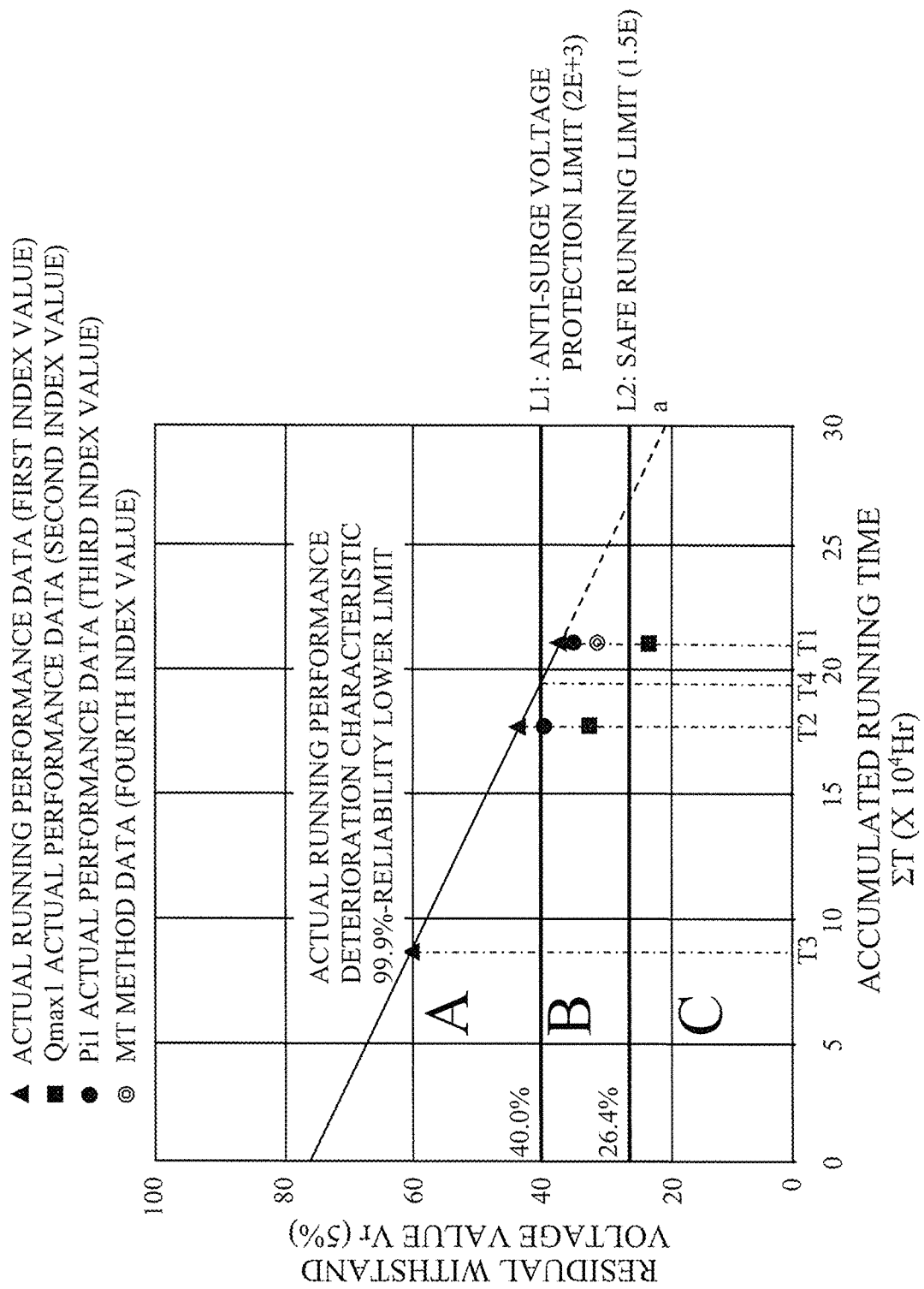
FIG. 2 is a graph for showing contents of estimation processing by the device for assessing remaining life of a generator according to the first embodiment of the present invention.

FIG. 2 is a graph for showing contents of the assessment processing by the device for assessing remaining life of a generator according to the first embodiment of the present invention. Specifically, FIG. 2 is a graph for showing an insulation deterioration characteristic about a stator coil of the generator, and results of calculating the four index values are shown in FIG. 2. The graph has an axis of ordinate on which the residual withstand voltage value Vr of the generator to be assessed is shown in percentage with an initial average withstand voltage value of the generator as 100(%). The graph has an axis of abscissas on which an accumulated running time $\Sigma T$ of the generator is shown in hours (Hr).

In FIG. 2, a straight line L1 representing an anti-surge voltage protection limit and a straight line L2 representing a safe running limit are shown. The anti-surge voltage protection limit is a voltage at which a surge protection device operates in order to protect a system from an abnormal voltage caused by lightning or the like. Insulation coordination of generator circuits is designed on the premise that generator coil insulation has a dielectric strength of (2E+3) kV which corresponds to approximately 40% of the initial average withstand voltage value. Here, the symbol E represents a rated voltage.

The safe running limit corresponds to a minimum residual withstand voltage value required to protect the generator from a system trouble. This value corresponds to a case in which generator coil insulation has a dielectric strength of 1.5E kV, and an approximately 26.4% (in the case of 11 kV) of the initial average withstand voltage value.

From the result of comparing a magnitude relationship to residual withstand voltage values that correspond to the straight line L1 and the straight line L2, an estimation value of the residual withstand voltage value Vr (%) can be divided into one of three categories, namely, A, B, and C, as shown in Table 1.

TABLE 1

Categorization example

| Category | Categorization criteria of respective categories | Categorization by Vr (%) |
| --- | --- | --- |
| A | Equal to or higher than operating voltage of surge protection device | 40% ≤ Vr |
| B | Equal to or higher than safe running limit voltage | 26.4% ≤ Vr < 40% |
| C | Less than safe running limit voltage | Vr < 26.4% |

When the calculated residual withstand voltage value Vr (%) belongs to Category A, this means that the residual withstand voltage value Vr (%) is equal to or higher than the anti-surge voltage protection limit. When the calculated residual withstand voltage value Vr (%) belongs to Category B, this means that the residual withstand voltage value Vr (%) is less than the anti-surge voltage protection limit but is equal to or higher than the safe running limit. When the calculated residual withstand voltage value Vr (%) belongs to Category C, this means that the residual withstand voltage value Vr (%) is less than the safe running limit.

Scores may therefore be allocated to Categories A to C as shown in Table 2.

TABLE 2

Example of score allocation to categories

| | Category | | |
| --- | --- | --- | --- |
| | A | B | C |
| Score | 10 points | 7 points | 1 point |

The allocation of scores to categories categorized based on the calculation result of the residual withstand voltage value Vr (%) as shown in Table 2 enables quantitative evaluation in which a higher score indicates lower urgency for insulation update, and a lower score indicates higher urgency for insulation update.

In FIG. 2, the accumulated running time $\Sigma T$ at the time of determination of the remaining life is expressed as $T1=21.0 \times 10^4$ (Hr). At the accumulated running time T1, four index values calculated by the index value calculation unit 12 are plotted. Specific numerical values thereof are shown in Table 5 described later.

At an accumulated running time T2 which is shorter than T1, three index values calculated by the index value calculation unit 12 are plotted. At an accumulated running time T3 which is shorter than T2, one index value calculated by the index value calculation unit 12 is plotted. The index values calculated by the index value calculation unit 12 can be stored in the storage unit 14.

At each of the accumulated running times T1, T2, and T3, an actual running performance deterioration characteristic as a 99.9%-reliability lower limit value is obtained from the first index value calculated based on the running time of the generator and the number of times of activation/shutdown of the generator. In FIG. 2, the actual running performance deterioration characteristic is shown as a downward-sloping straight line.

An accumulated running time T4 at an intersection point between the straight line representing the actual running performance deterioration characteristic and the straight line L1 representing the anti-surge voltage protection limit is $T4=19.7 \times 10^4$(Hr).

A specific case in which four index values calculated by the index value calculation unit 12 at the accumulated running time T1 take the following values (1) to (4) is considered.

First index value=37.5%  (1)

Second index value=35.8%  (2)

Third index value=23.6%  (3)

Fourth index value=30.0%  (4)

In this case, the insulation deterioration estimation unit 13 can identify categories and scores that correspond to the four index values by referring to the categorization shown in Table 1 and the score allocation shown in Table 2. The insulation deterioration estimation unit 13 can further calculate a total score P of the scores corresponding to the four index values.

The insulation deterioration estimation unit 13 can classify the necessity for insulation update of the generator to be assessed into a level based on the magnitude of the total score P. As an example, the insulation deterioration estimation unit 13 can execute classification into four levels by using an X point, a Y point, and a Z point which are set in advance as three threshold values for classification of the total score P into levels, and by following Table 3.

TABLE 3

Specific example of level classification

| Total score P | Level | Example of evaluation of insulation update |
|---|---|---|
| X point ≤ P | 1 | a level at which a mid and long-term insulation update plan is to be considered |
| Y point ≤ P < X point | 2 | a level at which a short-term insulation update plan is required |
| Z point ≤ P < Y point | 3 | a level at which urgent insulation update is required |
| P < Z point | 4 | a level at which the generator cannot be run |

For example, when X, Y, and Z are set to 31 points, 26 points, and 12 points, respectively, the insulation deterioration estimation unit 13 can classify the necessity for insulation update into a level based on the magnitude of the total score P and following Table 4.

TABLE 4

Specific example of level classification based on total score P

| | Total score P | | | |
|---|---|---|---|---|
| | 31 points or higher | 26 to 30 points | 12 to 25 points | 11 points or less |
| Level | 1 | 2 | 3 | 4 |

When the four index values shown in (1) to (4) are obtained, the insulation deterioration estimation unit 13 executes the categorization following Table 1, the score allocation following Table 2, and the level classification following Table 4.

For example, the first index value shown in (1), the second index value shown in (2), and the fourth index value shown in (4) are classified into Category B by following Table 1, and are each allocated 7 points by following Table 2. The third index value shown in (3) is classified into Category C by following Table 1, and allocated 1 point by following Table 2. The total score P of the four index values is accordingly 22 points, and is classified into Level 3 by following Table 4.

The contents of this processing are organized as shown in Table 5, and the insulation deterioration estimation unit 13 can identify the level at the accumulated running time T1 as Level 3.

TABLE 5

Specific example of assessment

| Index value | Data | Estimated BDV value | Category | Score |
|---|---|---|---|---|
| First index value | 210,000 [Hr] | 37.5% | B | 7 |
| Second index value | 6.4 [kV] | 35.8% | B | 7 |
| Third index value | 60,000 [pC] | 23.6% | C | 1 |
| Fourth index value | | 30.0% | B | 7 |
| | | Total | | 22 |
| | | Level | | 3 |

The contents of Table 1 to Table 4 are stored in advance in the storage unit 14 as table data.

A specific description is given next with reference to a flow chart on a flow of a remaining life assessment method to be executed by the remaining life assessing device 10 illustrated in FIG. 1. FIG. 3 is a flow chart for illustrating a series of processing steps of the remaining life assessment method to be executed by the remaining life assessing device 10 according to the first embodiment of the present invention.

In Step S301, the data acquisition unit 11 acquires a running time of the generator and the number of times of activation/shutdown of the generator as actual running performance data of the generator to be assessed. The data acquisition unit 11 further acquires, as electrical data of the generator to be assessed, the following four items.

Δ tan δ: Dielectric tangent
Pi: Rapid current increase voltage value
ΔI: Current increase rate
Qmax: Maximum discharge charge amount Next, in Step S302, the index value calculation unit 12 calculates the first index value, second index value, and third index value described above, based on the data acquired in Step S301.

Further, in Step S303, the index value calculation unit 12 calculates the fourth index value described above.

Next, in Step S304, the insulation deterioration estimation unit 13 identifies, for each of the four index values calculated in Step S302 and Step S303, a category that corresponds to the index value, based on the four calculated index values and table information that is stored in the storage unit 14 and that corresponds to Table 1.

Next, in Step S305, the insulation deterioration estimation unit 13 allocates, to each category identified in Step S304, a score that corresponds to the identified category, based on the identified category and table information that is stored in the storage unit 14 and that corresponds to Table 2, and then calculates the total score P.

Next, in Step S306, the insulation deterioration estimation unit 13 identifies a level that corresponds to the total score P calculated in Step S305, based on the calculated total score P and table information that is stored in the storage unit 14 and that corresponds to Table 3 or Table 4, and estimates the remaining life of the generator to be assessed.

Lastly, in Step S307, the insulation deterioration estimation unit 13 outputs the contents of the estimation in Step S306 as an assessment result, and ends the series of processing steps.

As described above, according to the first embodiment, there is included a configuration in which the residual withstand voltage value is estimated in the form of a plurality of index values by methods of the related art and the MT method, a level of necessity for insulation update is identified based on the magnitudes of the plurality of index values, and the remaining life is thus assessed.

With this configuration, the device for assessing remaining life of a generator and the method of assessing remaining life of a generator that are applicable to insulation deterioration assessment for Class-F insulation machines as well can be obtained. As a result, a trouble of the generator can be prevented, and efficient maintenance as well as planning of an appropriate update plan can be accomplished.

In particular, the use of the MT method in the calculation of the fourth index value ensures a relatively high assessment precision even when the number of samples of the electrical data that can be acquired is small. The precision of remaining life assessment can consequently be improved by making use of an estimation value of the residual withstand voltage value that is obtained by the MT method.

The configurations of Table 1 to Table 4 that are shown in the first embodiment described above are an example, and the same effects can be obtained also when other configurations are employed.

In the described categorization, the straight line L1 representing the anti-surge voltage protection limit and the straight line L2 representing the safe running limit are used as threshold values for categorization into three categories: A, B, and C. However, finer categorization into four or more categories is possible as well.

The categorization is also not required to use threshold values common to the four index values. Individual threshold values may be used for each of the four index values for categorization into an individual number of categories.

The allocation of scores to categories is also not required to be common to the four index values. For example, table information corresponding to Table 2 may be prepared separately for each index value so that a score is individually allocated to each index value.

In the described level classification, Table 3 or Table 4 is used for classification into four levels. However, finer classification into five or more levels is possible as well.

The insulating material used in the generator to be assessed deteriorates with age due to the surrounding environment, electrical stress, mechanical stress, and other factors as described in the beginning Deterioration assessment suited to the installation location can accordingly be performed at a higher precision by setting the number of categories, score allocation, and the number of levels that are appropriate for the surrounding environment and other conditions.

The description of the first embodiment deals with a generator as a type of rotating electrical machines. However, the first embodiment is also applicable to a motor and a generator motor which are rotating electrical machines other than the generator. Even when the remaining life assessment described in the first embodiment is applied to a motor or a generator motor, insulation deterioration assessment for Class-F insulation machines can be performed by the same method as the one for the generator, and the difference resides only in that the direction of current flow changes. In addition, insulation deterioration assessment can be performed by the same method irrespective of whether the motor and the generator are of a synchronous type or a dielectric type.

REFERENCE SIGNS LIST 10 remaining life assessing device, 11 data acquisition unit, 12 index value calculation unit, 13 insulation deterioration estimation unit, 14 storage unit

The invention claimed is:

1. A method of maintaining a rotating electrical machine that, includes an insulator, the method comprising:
assessing a remaining life of the rotating electrical machine, the assessing including
acquiring, as actual running performance data about the rotating electrical machine, a running time of, and the number of times of activation/shutdown of, the rotating electrical machine, and acquiring, as electrical data about the rotating electrical machine, a dielectric tangent, a rapid current increase voltage value, a current increase rate, and a maximum discharge charge amount,
storing, in advance, in a memory, an association relationship between the maximum discharge charge amount and a residual withstand voltage value as a first table, and an association relationship between the rapid current increase voltage value and the residual withstand voltage value as a second table,
calculating, as a first index value, an estimation value of the residual withstand voltage value of the rotating electrical machine based on the actual running performance data,
calculating, as a second index value, an estimation value of the residual withstand voltage value of the rotating electrical machine, with use of the first table, from the maximum discharge charge amount,
calculating, as a third index value, an estimation value of the residual withstand voltage value of the rotating electrical machine, with use of the second table, from the rapid current increase voltage value,
calculating, as a fourth index value, an estimation value of the residual withstand voltage value of the rotating electrical machine by performing analysis that uses a Mahalanobis-Taguchi (MT) method on each piece of the electrical data, and
assessing the remaining life of the rotating electrical machine by estimating the remaining life of the rotating electrical machine based on results of a comparison of four index values from the first index value to the fourth index value with a value indicating an anti-surge voltage protection limit and a value indicating a safe running limit;
generating an efficient maintenance plan and schedule for the rotating electrical machine based on the assessed remaining life of the rotating electrical machine; and
performing maintenance on the rotating electrical machine according to the generated efficient maintenance plan and schedule for the rotating electrical machine.

2. The method according to claim 1, wherein the remaining life assessing includes:
categorizing each of the four index values into one of a plurality of categories based on a magnitude of the residual withstand voltage value;

calculating a total score by allocating scores to the four index values with use of scores allocated to the plurality of categories, and by adding up the allocated scores; and estimating the remaining life of the rotating electrical machine from a level identified as a level that is allocated based on a magnitude of the total score.

3. The method according to claim 2, wherein the value indicating the anti-surge voltage protection and the value indicating the safe running limit are each compared to the magnitude of the residual withstand voltage value, and results of the comparison are used for the categorization into the plurality of categories.

\* \* \* \* \*